(12) United States Patent
Kazumi et al.

(10) Patent No.: US 8,216,420 B2
(45) Date of Patent: Jul. 10, 2012

(54) PLASMA PROCESSING APPARATUS

(75) Inventors: Hideyuki Kazumi, Hitachinaka (JP);
Akihiro Sano, Hitachi (JP); Akitaka Makino, Hikari (JP); Hitoshi Tamura, Hikari (JP); Masamichi Sakaguchi, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 644 days.

(21) Appl. No.: 11/447,011

(22) Filed: Jun. 6, 2006

(65) Prior Publication Data

US 2006/0283550 A1 Dec. 21, 2006

(30) Foreign Application Priority Data

Jun. 6, 2005 (JP) .................. 2005-164947

(51) Int. Cl.
*C23C 16/00* (2006.01)
*C23F 1/00* (2006.01)
*H01L 21/306* (2006.01)
(52) U.S. Cl. ............... 156/345.41; 118/723 MW
(58) Field of Classification Search ............ 156/345.41; 118/723 MW
See application file for complete search history.

(56) References Cited

U.S. PATENT DOCUMENTS

| | | | | |
|---|---|---|---|---|
| 4,970,435 A | * | 11/1990 | Tanaka et al. | 315/111.21 |
| 5,520,771 A | * | 5/1996 | Kanai et al. | 156/345.41 |
| 5,587,205 A | * | 12/1996 | Saito et al. | 427/553 |
| 6,016,766 A | * | 1/2000 | Pirkle et al. | 118/723 MW |
| 6,361,707 B1 | * | 3/2002 | Tanaka et al. | 216/69 |
| 6,657,151 B2 | * | 12/2003 | Ishii et al. | 219/121.43 |
| 2003/0178143 A1 | * | 9/2003 | Perrin | 156/345.41 |
| 2004/0261717 A1 | * | 12/2004 | Ishii et al. | 118/723.001 |

FOREIGN PATENT DOCUMENTS

| | | |
|---|---|---|
| JP | 2001-085399 | 3/2001 |
| JP | 2001-332541 | 11/2001 |
| JP | 2001-358127 | 12/2001 |
| JP | 2002-237483 | 8/2002 |
| JP | 2003-188152 | 7/2003 |
| JP | 2003-243376 | 8/2003 |
| KR | 2002-091430 | * 12/2002 |

* cited by examiner

*Primary Examiner* — Rakesh Dhingra
(74) *Attorney, Agent, or Firm* — Antonelli, Terry, Stout & Kraus, LLP.

(57) ABSTRACT

A plasma processing apparatus for generating highly-uniform and stable plasma. In an apparatus for generating plasma by using a μ wave, concerning a method for rotating the μ wave in terms of time, a plurality of (larger than two and smaller than four) waveguides are used, then forming an angle between the respective waveguides, and setting a phase difference between respective electric fields therein. This configuration allows introduction of the circularly polarized wave into a processing chamber. At this time, there are provided configuration components such as a waveguide locating method, a unit therefor, a μ-wave merging box, and a reflective-wave control unit using a reflection control chamber.

5 Claims, 7 Drawing Sheets

IN-WAVEGUIDE
ELECTRIC FIELD

IN-PLASMA
ELECTRIC FIELD

IN-PLASMA μ-WAVE
ELECTRIC-FIELD
EQUIPOTENTIAL LINES
(ONLY COIL 22a)

IN-PLASMA μ-WAVE
ELECTRIC-FIELD
EQUIPOTENTIAL LINES
(ONLY COIL 22b)

IN-WAVEGUIDE ELECTRIC FIELD

IN-PLASMA ELECTRIC FIELD
($n_e = 6 \times 10^{16} m^{-3}$)

IN-PLASMA ELECTRIC FIELD
($n_e = 6 \times 10^{16} m^{-3}$)

DIRECTION OF ELECTRIC FIELD

ELECTRIC-FIELD EQUIPOTENTIAL LINES (REACTOR IS ABSENT)

ELECTRIC-FIELD EQUIPOTENTIAL LINES (REACTOR IS PRESENT)

PLASMA PROCESSING APPARATUS

BACKGROUND OF THE INVENTION

1. Field of the Invention

The present invention relates to a plasma processing apparatus for performing processings such as etching, film-formation, and ashing of a processing-target object by generating plasma using a high-frequency wave.

2. Description of the Related Art

The miniaturization and high-integration implementation of ULSI devices have been developed rapidly. For example, the device machining whose machining dimension is equal to a few tens of nanometers is now being carried out. Also, large-diameter implementation of the φ-300-nm wafer is now being developed. Namely, the high-accuracy implementation and large-diameter accomplishment are requested at present. Of them, since the gate machining is an important factor which rules operation speed and integration scale of the devices, its machining dimension critical-dimension (CD) is requested most severely. Simultaneously, new materials, such as multilayered film and metal gate, have come to be used as the gate structure. The difference in the machined film type requires a difference in the gas to be used. Accordingly, distribution of the plasma or radical also varies in accompaniment therewith. Also, accomplishing an enhancement in the machining throughput requires high-density implementation of the plasma. One method therefor is high-frequency implementations of the excitation frequency. Of these implementations, the plasma processing apparatus using a μ wave is widely used at present. This is because the plasma generation is executable in the used process area ranging from an about 0.1-Pa low-pressure area to an about 10-Pa high-pressure area, and because the high-density implementation related with the throughput is easy to accomplish. On the other hand, however, the use of the μ wave causes eigen "modes" to rise which are determined by its introduction method and the apparatus size. As a result, there exists a problem that the μ wave is likely to become nonuniform in the radial and circumferential directions. As a method for solving this problem, various types of antennas and slots have been considered from conventionally. This method, however, finds it difficult not only to eliminate electric-field distributions of near fields radiated from the various types of antennas and slots, but also to eliminate the eigen modes caused to rise in the apparatus size.

As a method which, of the eigen modes, eliminates the nonuniformity in the circumferential direction, there exists a method of introducing a circularly polarized wave. The circularly polarized wave refers to an electromagnetic wave whose electric-field direction rotates one turn during one period within a plane perpendicular to a traveling direction of the electromagnetic wave. As its example, the disclosure has been made in a cited embodiment in JP-A-2003-188152 concerning a method where a circularly polarized wave converter is combined with a cylindrical waveguide. As the circularly polarized wave converter, there exists a one where, as illustrated in FIG. 16 in the cited conventional embodiment 1, mutually-opposed and metallic circular-cylinder-shaped stubs 591A and 591B are provided in one pair or plural pairs on inner wall of the cylindrical waveguide 541. The stubs forming the one pair are located in a direction which forms 45° with respect to the main direction of the electric field of a linearly polarized wave $TE_{11}$ mode to be introduced. When the stubs are provided in the plural pairs, the stubs are located with a spacing of $\lambda_g/4$ ($\lambda_g$ denotes in-waveguide wavelength in the cylindrical waveguide) with respect to the axis direction of the cylindrical waveguide 541. Also, as a unit which exhibits basically the same effect, there exists a unit where one or plural rod-shaped dielectric or dielectrics 591C is or are used in the direction perpendicular to the axis direction of the cylindrical waveguide.

As a conventional embodiment 2, a circularly polarized wave antenna has been disclosed in JP-A-2003-188152. Here, there are provided a cylindrical waveguide and a rectangular waveguide whose one side-surface is connected to the other end of the cylindrical waveguide. Moreover, the circularly polarized wave antenna is provided therebetween. This circularly polarized wave antenna is configured by one slot or plural slots apertured in the cylindrical waveguide on the one side-surface of the rectangular waveguide. This embodiment indicates and describes, as the one slot or plural slots, two slots whose mutual lengths differ from each other and which cross with each other at their centers.

As a conventional embodiment 3, the following method has been disclosed in JP-A-2001-358127: Namely, four power-feeding units are provided on one and the same plane perpendicular to the axis direction of a main coaxial path, and a 90-° phase difference is set between the respective four power-feeding units, then feeding μ waves. Also, this embodiment illustrates a conceptual diagram where the four μ waves with the different phase differences set are distributed from a single μ-wave generation source.

SUMMARY OF THE INVENTION

In the conventional technology 1, the metallic stubs 591A and 591B are provided locally in the cylindrical waveguide. As a result, there exists a problem that the electric field is concentrated on the top-ends, and that an abnormal discharge becomes likely to occur. Also, in the case of using the rod-shaped dielectric or dielectrics 591C, dielectric loss of the dielectric or dielectrics gives rise to liberation of heat. As a result, a problem exists in the stability at the time of continuous operation. Also, there exists a problem that the circularly polarized wave is not implemented at the time of a load variation in the plasma. This problem will be explained next.

The circularly polarized wave antenna in the conventional technology 2 is configured by the one slot or plural slots apertured in the cylindrical waveguide on the one side-surface of the rectangular waveguide. This technology indicates and describes, as the one slot or plural slots, the two slots whose mutual lengths differ from each other and which cross with each other at their centers. Providing the one slot antenna or plural slot antennas apertured is equivalent to locating metal in the portion of the antenna or antennas, and forming the other portions into cavities. This situation, accordingly, is the same as in the conventional technology 1. Also, this technology describes that the two slots (i.e., cross slots), whose mutual lengths differ from each other and which cross with each other at their centers, are provided as the one slot or plural slots, and that the circularly polarized wave will be acquired at the point at which the two slots cross with each other. However, if the high-frequency wave feeding side introduces the circularly polarized wave, the reflection occurs in the plasma portion. As a result, the incident wave and the reflective wave interfere with each other, thereby causing a standing wave to rise among the plasma, the waveguide, and the circularly polarized wave antenna. On account of this, there exists the following problem: Namely, if the plasma state (i.e., plasma density) varies, the electric-field direction of the circularly polarized wave cannot rotate within the plasma even if the circularly polarized wave has been introduced. Here, the explanation will be given below concerning a variation in the electric-field distribution caused by the plasma load. In the case of using the high-frequency wave, there exists the so-called "cut-off density" which is determined by the frequency of the high-frequency wave. Here, if the plasma density is lower than the cut-off density, the high-frequency wave can propagate within the plasma; whereas, if the plasma density becomes higher than the cut-off density, the high-frequency wave cannot propagate within the plasma. The cut-off density is represented as $$n_c = m_e \epsilon_0 (2\pi f/e)^2,$$

where f: the frequency, $m_e$: mass of electron, $\epsilon_0$: permittivity of vacuum, e: elementary electric charge. One resultant phenomenon is that the place at which the high-frequency wave is reflected varies depending on whether the plasma density is higher or lower than the cut-off density. As a result, mode of the standing wave turns out to vary. Also, the reflectivity when the plasma is seen from the waveguide side turns out to vary. As a consequence, even if configurations, lengths, cross angle of the two slots have been properly selected for a certain specific plasma density, if the plasma density varies as the result of a change in power of the high-frequency wave, the influence by the reflective wave prevents the electric-field direction of the circularly polarized wave from rotating even if the circularly polarized wave has been introduced.

In the conventional technology 3, the four power-feeding units are provided on one and the same plane perpendicular to the axis direction of the main coaxial path, and the 90-° phase differences are set among the four power-feeding units. In comparison with the method in the conventional technology 1 where the metallic stubs are provided within the cylindrical waveguide, and the method in the conventional technology 2 where the two slots are provided in the cylindrical waveguide, intensity of the electric field is controlled on the feeding side. This makes it unlikely that the influence by the reflective wave will be exerted on the electric-field direction. The influence by the reflection, however, causes the specific mode to rise in response to the plasma density between the plasma and the waveguide. Accordingly, this portion cannot be controlled on the feeding side. On account of this, in this method as well, it becomes difficult to introduce the circularly polarized wave in response to the plasma load.

Here, the explanation will be given below concerning the modes of the μ wave by selecting, as an example, a cavity resonator 101 (FIG. 10A) using a 2.45-GHz μ wave. Using a rectangular waveguide for introducing the μ wave, the μ wave is guided to a basic circular waveguide 100 via an elbow portion. After that, the μ wave is introduced into the cavity resonator 101 whose inner diameter is enlarged, then being introduced into plasma 103 via an introduction window. In the rectangular waveguide, a $TE_{10}$ mode is excited. When the μ wave is connected to the circular waveguide 100 via the elbow portion, a $TE_{11}$ mode (i.e., equipotential lines of the electric field are elliptic) comes to rise as illustrated in FIG. 10B. Defining the main direction of the electric field as the x direction, and the direction perpendicular thereto as the y direction, the $TE_{11}$ mode in the basic circular waveguide 100 and modes attributed to diameter of a reactor 102 and the plasma density come to rise inside the cavity resonator 101. In addition to higher-order modes of the introduced $TE_{11}$ mode, such as $TE_{12}$ and $TE_{13}$, modes such as $TM_{11}$ and $TM_{12}$ appear by the enlargement of the diameter (although, strictly speaking, the appearances of these modes vary depending on the reactor diameter). When the plasma density is lower than $n_c$, as illustrated in FIG. 10C, the $TE_{12}$ mode (i.e., the equipotential lines of the electric field are ellipses existing at two locations with the x axis sandwiched therebetween) becomes the principal mode within the plasma. If the plasma density rises, the $TM_{11}$ or $TM_{12}$ mode becomes the principal mode. FIG. 10D illustrates the case where the plasma density is set at $n_c = 10 \times 10^{16} \, m^{-3}$. At this time, the equipotential lines of the electric field appear at two locations in the incident electric-field direction (the x-axis direction), and the electric-field component comes to include the z-direction (i.e., height direction of the circular waveguide) component as well, in addition to the y-direction component. In this way, the $TM_{11}$ mode has become the principal mode within the plasma. In this way, the mode of the electric field varies and comes to differ depending on the plasma density.

Here, the investigation has been made concerning the effects of the methods for introducing the circularly polarized wave in the conventional technologies 1 to 3. As the representative case, the explanation will be given below regarding the case of using the dielectric or dielectrics (refer to FIG. 11A) in the conventional technology 1. As illustrated in FIG. 11B, the dielectric is located inside the circular waveguide 100 (φ 90) such that the dielectric is inclined by 45° with respect to the direction of the electric field. Here, quartz is used as the dielectric. If no dielectric is inserted, the electric-field distribution inside the circular waveguide 100 is the elliptic $TE_{11}$ mode as is illustrated in FIG. 10B. FIG. 11C and FIG. 11D illustrate calculation results of the electric-field distribution inside the circular waveguide 100 at the time when the dielectric is inserted. FIG. 11C illustrates the calculation result at the time when the bottom portion of the circular waveguide 100 is set into a non-reflection terminal end (i.e., the reactor 102 is absent). This calculation result indicates that the electric field inside the circular waveguide 100 has become circular. This means that the elliptic electric-field distribution has rotated in terms of time. Namely, it turns out that the circularly polarized wave has been introduced. If, however, the circular waveguide 100 is connected to the reactor 102, i.e., to the plasma 103, the electric-field distribution restores back to the original elliptic shape as is illustrated in FIG. 1D. This is because of the following reason:

As described earlier, the mode of the electric field inside the cavity resonator varies and comes to differ. Accordingly, the reflective wave reflected back from the plasma side and the reflective wave's phase also vary and come to differ. This reflective wave obstructs the incoming circularly polarized wave. For this reason, the electric-field distribution restores back to the original elliptic shape. The circumstances are basically the same in the cases other than the above-described representative case, i.e., the metallic stubs, the slot antenna, and the four-direction feeding. Namely, even if the circularly polarized wave is introduced, implementing the circularly polarized wave becomes difficult unless there is provided a unit for controlling the reflective wave. Here, the explanation has been given selecting the cavity resonator as the example. However, the circumstances where the mode caused to rise by the plasma density varies depending on the plasma density are also basically the same in the case of the radial slot antenna introduced in the conventional technologies 2 and 3. Namely, the mode varies into the state where either of the $TM_{mn}$ mode and the $TE_{mn}$ mode becomes principal depending on the plasma density. Consequently, it is conceivable that implementing the circularly polarized wave is also difficult similarly. Implementing the circularly polarized wave (i.e., rotating the electric-field direction of the circularly polarized wave) requires an idea about the unit for controlling the reflective wave from the plasma side, in addition to an idea about the high-frequency wave introduction method.

It is an object of the present invention to provide a plasma processing apparatus for generating highly-uniform and stable plasma by introducing a circularly polarized wave whose electric field is rotated in terms of time in a wide area of the plasma density in the system for generating plasma by using a high-frequency wave (i.e., µ wave).

According to one aspect of the present invention, a plasma processing apparatus of the present invention includes a processing chamber having a vacuum, a gas being supplied to the processing chamber, a support electrode provided inside the processing chamber and supporting a processing-target object, a hollow resonator chamber (cavity resonator) for supplying waves to the processing chamber, an introduction window for separating the resonator chamber from the processing chamber, a waveguide whose one end is connected to the resonator chamber, a tuning box connected to the waveguide, merging the µ-waves, and controlling reflection of the µ-waves, and a plurality of (larger than two and smaller than four) rectangular waveguides connected to the tuning box, wherein there is provided a unit for controlling phases of electric fields which propagate within the rectangular waveguides.

In the above-described apparatus, when two rectangular waveguides are used as the plurality of rectangular waveguides, the two rectangular waveguides are located such that the two rectangular waveguides form an angle of substantially 90° with each other on a flat plane parallel to the tuning box. Simultaneously, using the phase control unit for controlling the phases of the electric fields within both of the two rectangular waveguides, a phase difference of substantially 90° is set between the phases of the electric fields. As the phase control unit or method, in addition to a phaser, the difference in length between the two rectangular waveguides may also be employed as $\Delta l = \lambda_g/4 \times (2n+1)$. Here, $\lambda_g$ denotes in-waveguide wavelength within the rectangular waveguides, and n denotes an integer. When three rectangular waveguides are used, the three rectangular waveguides are located such that the three rectangular waveguides form an angle of substantially 120° with each other, and such that a phase difference between the respective electric fields within the three rectangular waveguides becomes equal to 120°. Similarly, when four rectangular waveguides are used, the four rectangular waveguides are located such that the rectangular waveguides adjacent to each other form an angle of substantially 90°, and such that a phase difference between the respective electric fields within the rectangular waveguides adjacent to each other becomes equal to 90°. Here, the explanation has been given regarding the cases where the three or more rectangular waveguides are used. From a realistic point-of-view, however, the two rectangular waveguides will be used considering the simplicity. Accordingly, the explanation will be given below concerning a µ-wave introduction method where the two rectangular waveguides are used. Axis directions (i.e., directions in which the electric fields propagate) of the two rectangular waveguides are connected to side surface of the tuning box. Here, as a coordinate system, height direction (i.e., direction resulting from connecting the resonator chamber with the processing chamber) is defined as the z direction, and the x and y directions will be employed on a plane perpendicular to the z direction. Of the two rectangular waveguides, one is located in the x direction, and the other is located in the y direction. The electric fields supplied from the two rectangular waveguides are superimposed in the tuning box. As a method of introducing the electric fields into the tuning box, the two rectangular waveguides are merely connected to the side wall of the tuning box, or the two rectangular waveguides may be crossed with each other inside the tuning box. Changing lengths of the two rectangular waveguides thus crossed makes it easier to rotate the electric fields. The electric fields are supplied from both of the x and y directions with the phase difference 90° set therebetween. As a result, at a certain point-in-time, the electric field in the y direction becomes equal to 0 when the electric field in the x direction is its maximum; whereas, the electric field in the y direction becomes its maximum (minimum) when the electric field in the x direction is equal to 0. A reflection control chamber is provided under this tuning box. Moreover, an ordinary waveguide (circular waveguide) under the reflection control chamber is connected thereto. Diameter of the reflection control chamber is made larger than that of the circular waveguide underneath. A mechanism capable of effectively changing height or the diameter of the reflection control chamber is located therein. For example, a metallic plate (stub is also advisable enough) is located to be extracted and inserted, thereby changing the height or the diameter of the reflection control chamber. Changing the height or the diameter of the reflection control chamber varies a mode which may rise at the portion, thereby making it possible to control (i.e., reduce) the influence by the reflective wave reflected back from the plasma. Also, applying a magnetic field into the inside of a reactor causes anisotropy to appear in the conductivity $\sigma$ within the plasma depending on direction of the magnetic field and its intensity. Here, since plasma current $J_P$ flowing within the plasma is represented as $J_P = \sigma E$, changing the magnetic field makes it possible to change the distribution. Namely, subjecting the magnetic field to the time modulation changes the conductivity $\sigma$, thereby allowing the electric-field distribution to be changed in terms of time. This permits assistance of the rotation of the electric field. If the plasma density varies, the intensity/direction of the magnetic field is adjusted. This adjustment allows circumferential-direction distribution of absorption power into the electric field and the plasma to be uniformalized in terms of time.

According to the present invention, it becomes possible to provide the plasma processing apparatus for implementing the high-density and high-uniformity plasma by rotating a µ wave in a wide parameter area in the apparatus for generating the plasma by using the µ wave. As a consequence, it becomes possible to implement high processing speed and uniform machining of a large-diameter wafer.

Other objects, features and advantages of the invention will become apparent from the following description of the embodiments of the invention taken in conjunction with the accompanying drawings.

DESCRIPTION OF THE INVENTION

Hereinafter, the explanation will be given below concerning embodiments of a method for rotating a μ wave in terms of time in an apparatus for generating plasma by using the μ wave.

Figure 1A:
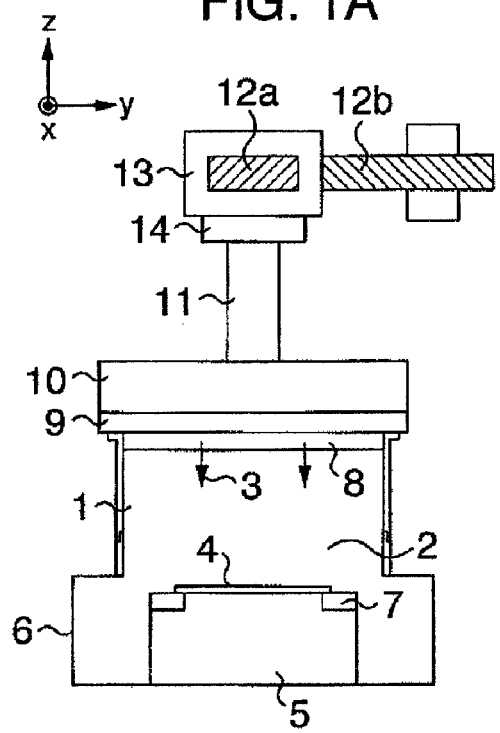
FIG. 1A and FIG. 1B illustrate the plasma processing apparatus according to a first embodiment of the present invention.
Figure 1B:
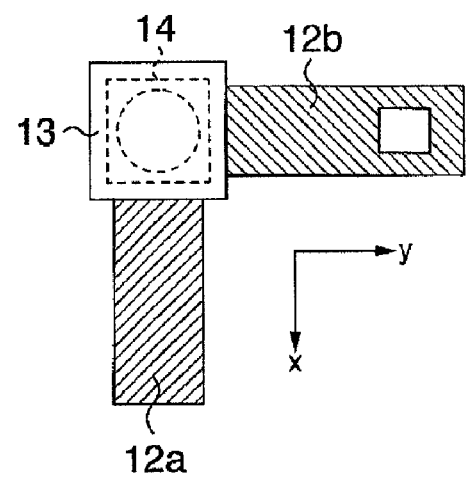

FIG. 1A and FIG. 1B illustrate a first embodiment of the present invention.

A processing chamber 2 of a plasma processing apparatus is composed of anodized aluminum or the like. The processing chamber 2 is a vacuum chamber which is equipped with a support base (electrode) 5 for supporting a 15 processing-target object (i.e., wafer) 4. A gas 3 introduced into the processing chamber 2 is exhausted by an exhaust system 6. A susceptor 7 for mounting the wafer 4 thereon is located on the support base 5. A shower plate 8 for introducing the gas 3 and an introduction window 9 for making vacuum separation as well as introducing a μ wave are mounted on the upper portion of the processing chamber 2. A cavity unit 10 exists on the introduction window 9, and becomes a unit for adjusting the distribution and intensity of the μ wave introduced. Changing the height of this portion 10 makes it possible to change the distribution (i.e., mode) of the μ wave to be introduced into the processing chamber 2. A circular waveguide 11 is connected to the cavity unit 10. A plurality of (larger than two) rectangular waveguides 12, which exist on a plane perpendicular to the principal axis of this circular waveguide 11, and which allow the μ wave to propagate, are connected to the circular waveguide 11. As the representative case, the explanation will be given below regarding the case where the two rectangular waveguides are used. The rectangular waveguide 12a and the rectangular waveguide 12b (which are assumed to be oriented in the x and y directions, respectively) are located with an angle of substantially 90° set therebetween. A rectangular waveguide, one side of whose rectangular-waveguide cross section is equal to, e.g., 109.2 mm and the other side of whose rectangular-waveguide cross section is equal to, e.g., 54.9 mm, is used as the rectangular waveguides 12a and 12b, so that a $TE_{10}$ mode will rise within each of the rectangular waveguides 12a and 12b. A phase difference of 90° is set between phases of electric fields propagating within the two rectangular waveguides 12a and 12b. As a unit or method for setting the phase difference, a phaser may be used therefor, or the path difference $\Delta L = \lambda_g/4 \times (2n-1)$ may be set between lengths of the two rectangular waveguides. Here, $\lambda_g$ denotes in-waveguide wavelength of the μ wave, and n denotes an integer. When a 2.45-GHz μ wave is used, the path difference is set at about $\Delta L = 37 \times (2n-1)$ mm.

The two rectangular waveguides 12a and 12b with the phase difference set therebetween are merged in a tuning box 13. The $TE_{10}$ modes (linearly polarized waves) oriented in the x and y directions respectively are superimposed within the tuning box 13, thereby becoming a circularly polarized wave whose electric field is rotated in terms of time. A reflection control chamber 14 is located under the tuning box 13. The μ wave is supplied to the circular waveguide 11 and the processing-chamber side via the reflection control chamber 14. Diameter of the reflection control chamber is made larger than that of the circular waveguide 11. When the basic waveguide of φ90 is used as the circular waveguide 11, the reflection control chamber is assumed to be a box-shaped chamber whose horizontal cross-section diameter is larger than at least 110 mm. Only a $TE_{11}$ mode is excited within the φ-90 basic circular waveguide 11. This $TE_{11}$ mode, however, will be reflected inside the cavity unit 10 and the processing chamber 2 (which are in the downstream from the μ wave), then returning back as the $TE_{11}$ mode again. Furthermore, this returning $TE_{11}$ mode will be superimposed with the incident wave, thereby obstructing the rotation of the electric field (i.e., circularly polarized wave). Here, however, the reflection control chamber 14, whose diameter is larger than that of the circular waveguide 11, has been set up. This reflection control chamber 14 permits a mode other than the $TE_{11}$ mode to rise therein. This electric field can be rotated in terms of time. Consequently, it becomes possible to reduce the influence by the reflective wave reflected back as the $TE_{11}$ mode. Here, the explanation has been given regarding the example where the reflection control chamber is rectangular parallelepiped. The reflection control chamber, however, may also be cylindrical or polygonal. Namely, whatever configuration is advisable enough as long as it permits a certain higher-order mode than the $TE_{11}$ to rise. Moreover, the explanation has been given regarding the method where the two rectangular waveguides are used. The circumstances, however, are also basically the same in the case where the three or more rectangular waveguides are used. When the three rectangular waveguides are used, the three rectangular waveguides 12a, 12b, and 12c are located with an angle of substantially 120° set between the respective waveguides. Also, a phase difference of 120° is set between the respective electric fields within the respective waveguides. Then, the three rectangular waveguides are merged in the tuning box 13. When the four rectangular waveguides are used, the four rectangular waveguides are located with an angle of substantially 90° set between the respective four waveguides in sequence (i.e., angles of 90°, 180°, and 270° are set with the waveguide selected as the reference). Also, phase differences between the respective electric fields within the respective waveguides are set at 90°, 180°, and 270°. Then, the four rectangular waveguides are merged in the tuning box 13.

Figure 2A:
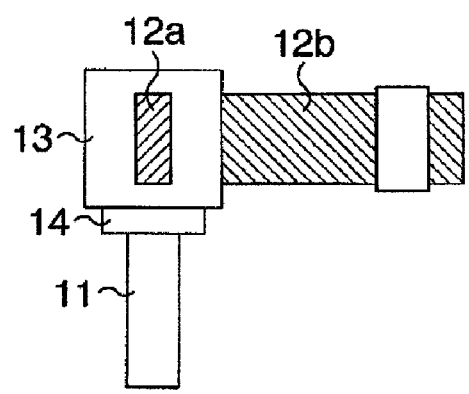
FIG. 2A and FIG. 2B illustrate a second embodiment regarding the µ-wave introduction method used in the present invention.
Figure 2B:
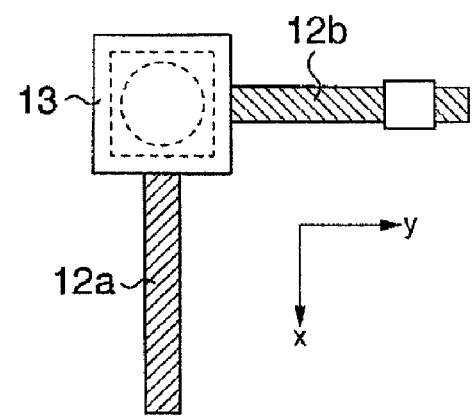

FIG. 2A and FIG. 2B illustrate a second embodiment of the present invention. Here, attention is focused on the μ-wave introduction method used in the plasma processing apparatus. In the embodiment illustrated in FIG. 1A and FIG. 1B, the plurality of (n units) rectangular waveguides 12 are located such that, of their rectangular cross-sections, the shorter sides are sequentially arranged in the up-and-down direction, in other words, the E surfaces of the waveguides 12 are sequentially arranged in the up-and-down direction. When the number of the waveguides 12 is two, they are located with an angle of substantially 90° set therebetween. When the number is n (>2), they are located with an angle of 360/n° set between the respective waveguides 12. Moreover, in the case of n=2, a phase difference of 90° is set between respective electric fields within the respective waveguides 12. In the case of n (>2), a phase difference of 360/n° is set between respective electric fields within the respective waveguides 12. Here, heights at which each rectangular waveguide 12 and the tuning box 13 are connected to each other need not necessarily be positioned on one and the same plane. Namely, the heights may be changed for each waveguide 12.

Figure 3A:
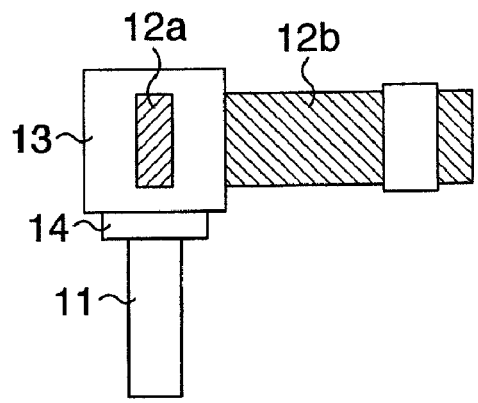
FIG. 3A and FIG. 3B illustrate a third embodiment regarding the µ-wave introduction method used in the present invention.
Figure 3B:
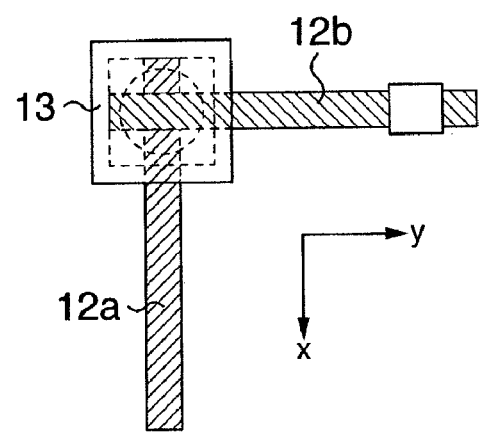

FIG. 3A and FIG. 3B illustrate a third embodiment of the present invention. A feature of this embodiment is that the rectangular waveguides 12 are crossed with each other inside the tuning box 13. The waveguides 12 are crossed with each other inside the tuning box 13, then aperturing the lower sides (i.e., processing-chamber side) of the waveguides crossed. At this time, the direction is advisable enough in which the E surfaces of the waveguides 12 are arranged in the right-and-left direction. Otherwise, as is the case with the above-described second embodiment, the direction is advisable enough in which the E surfaces of the waveguides 12 are sequentially arranged in the up-and-down direction. Here, the explanation will be given below regarding the case where the E surfaces of the waveguides 12 are sequentially arranged in the up-and-down direction. The rectangular waveguide 12a in the x direction and the rectangular waveguide 12b in the y direction are connected to each other at the center of the tuning box 13. Only a specific mode (i.e., the $TE_{11}$ mode, here) rises inside the rectangular waveguides. Consequently, it becomes possible to reduce the influence by the reflective wave reflected back from the processing-chamber side. Also, the length along which the rectangular waveguides are crossed with each other is changed depending on the introduction direction, thereby asymmetricalizing or eccentricalizing the electric fields in the x and y directions with respect to the center at the point where they are superimposed with each other. Eccentricalizing the electric fields also makes it possible to reduce the influence by the reflective wave (i.e., the $TE_{11}$ mode within the circular waveguide 11, here). It is conceivable that this scheme allows the circularly polarized wave to be introduced in a wide range of the plasma load. For example, assume the following case: Namely, n=2, and the path difference of $\lambda_g/4$ (37 mm) has been already set in the x and y directions and outside the tuning box 13, and the path in the y direction is longer by 37 mm. At this time, if, inside the tuning box 13, the length of the x-direction rectangular waveguide 12a and that of the y-direction rectangular waveguide 12b are set at about 27.5×2 mm and 27.5+20 mm respectively, the electric fields become easier to rotate as compared with the case where the rectangular waveguides are the same in length. Also, changing the lengths of the rectangular waveguides becomes a method for adjusting electric-field intensities within the rectangular waveguides in the x and y directions.

Figure 4A:
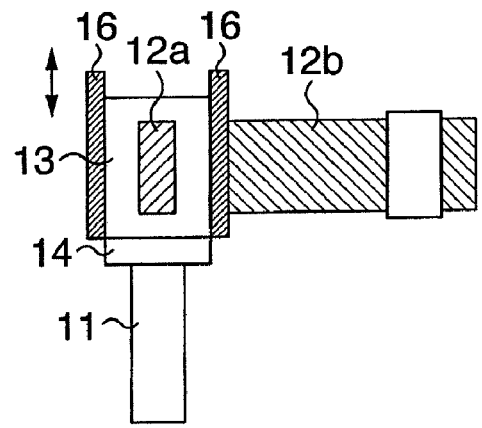
FIG. 4A to FIG. 4D illustrate a fourth embodiment regarding the µ-wave introduction method used in the present invention.
Figure 4B:
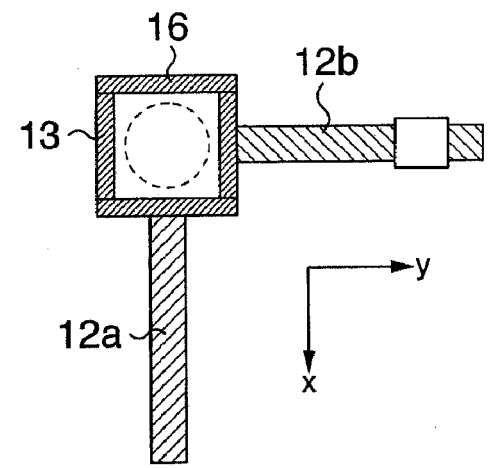
Figure 4C:
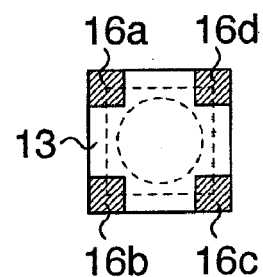
Figure 4D:
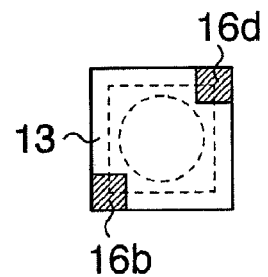

FIG. 4A to FIG. 4D illustrate a fourth embodiment of the present invention. Here, of the μ-wave introduction method used in the plasma processing apparatus, attention is focused on structures of the tuning box 13/reflection control chamber 14 for superimposing the μ waves. The tuning box 13 is made larger than the diameter of the rectangular waveguides or that of the circular waveguide. A feature of this embodiment is that there is provided a reflection control unit 16 for changing the diameter or height of the tuning box 13. This reflection control unit 16 may be provided in the reflection control chamber 14. The unit 16 is located in the tuning box 13/reflection control chamber 14 as a metallic member. Raising or lowering the metallic member changes the diameters or heights of the tuning box 13/reflection control chamber 14, thereby controlling a mode which is to rise. This allows an increase in the degree of freedom for controlling the reflective wave at the time when the plasma density varies. The unit 16 may also be a dielectric. Also, as illustrated in FIG. 4C, the unit 16 may also be of rod shape. Also, concerning the location method, as illustrated in FIG. 4D, the two locations (when the waveguides used are two) are also preferable. Whatever reflection control unit 16 is preferable as long as it is capable of changing the diameters or heights of the tuning box 13/reflection control chamber 14.

Figure 5:
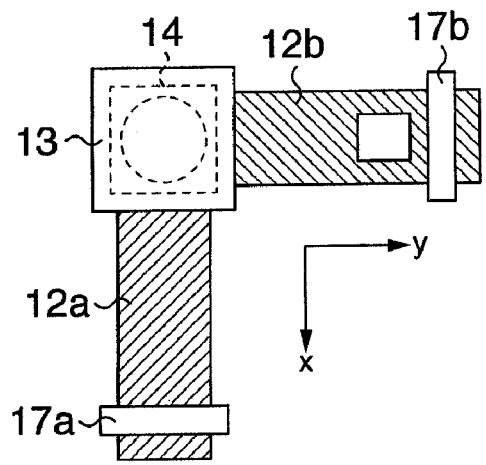
FIG. 5 illustrates a fifth embodiment regarding the µ-wave propagation chamber used in the present invention.
Figure 6A:
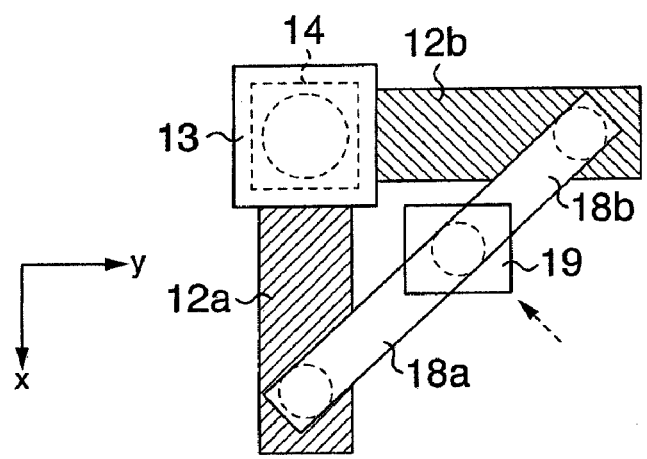
FIG. 6A and FIG. 6B illustrate a sixth embodiment regarding the µ-wave introduction method used in the present invention.
Figure 6B:
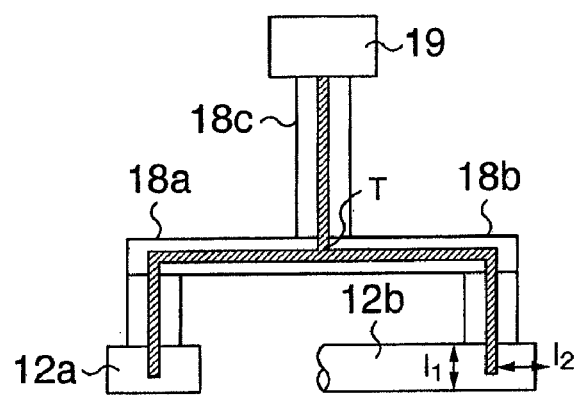

FIG. 5 illustrates a fifth embodiment of the present invention. A feature of this embodiment is that, in the plasma processing apparatus, there is provided a unit for varying the electric-field intensity within each of the rectangular waveguides 12. A tuner 17 is provided halfway on each of the rectangular waveguides 12. It is assumed that the tuner 17 is equipped with a method for monitoring the intensity and phase of a μ wave. FIG. 5 illustrates the case where two waveguides 12a and 12b are used. The tuner 17 is located on each rectangular waveguide, and tuners 17a and 17b in the x and y directions change the intensities of μ waves in the x and y directions (in some cases, phase difference between the electric fields in the x and y directions varies in a spillover manner). Even if the plasma load varies, this configuration allows implementation of the circularly polarized wave. Also, when a stub is used as the tuner 17, taking advantage of position of the stub makes it possible to know the plasma load (i.e., so-called "Ldγ"). Consequently, based on this value, FIG. 6A and FIG. 6B illustrate a sixth embodiment of the present invention. A feature of this embodiment is that, in the plasma processing apparatus, electric power is fed to the plurality of rectangular waveguides 12 by a single power-feeding unit. A μ wave generated by a μ-wave generation unit 19 is transmitted to the rectangular waveguides 12a and 12b via a coaxial waveguide 18. A coaxial waveguide 18c is branched into directions of the waveguides 12a and 12b at a branch point T. The coaxial waveguide 18 and the rectangular waveguides 12a and 12b are connected to each other as illustrated in FIG. 6B. When letting length of the coaxial axis protruding into each rectangular waveguide be $l_1$, and distance between the coaxial axis and terminal end (i.e., short-circuit end) of each rectangular waveguide be $l_2$, adjusting $l_1$ and $l_2$ allows implementation of the tuning between the coaxial axis and each rectangular waveguide. Next, in order to implement a phase difference to be set between the μ waves, the following two ways are conceivable: Namely, the phase difference is set 1) in the coaxial-axis portion, or 2) in the rectangular waveguides. Since 2) is more desirable from the point-of view that the rectangular waveguides are closer to the plasma side, and thus are easier to control, the phase difference will be set in the rectangular waveguides. Namely, $\lambda_g/4 \times (2n-1)$ is set as the difference between the path lengths in the rectangular waveguides 12a and 12b in the x and y directions. This allows the 90-° phase difference to be set between the μ waves in the x and y directions. A phaser may be provided in the rectangular waveguides. Also, it is desirable to provide the tuner (stub) in the rectangular waveguides as a correction unit to be used when the plasma itself is asymmetricalized or eccentricalized. This configuration adjusts the electric-field intensities in the x/y directions, thereby correcting rotation of the electric field to uniformalize the electric-field distribution in the circumferential direction.

Figure 7A:
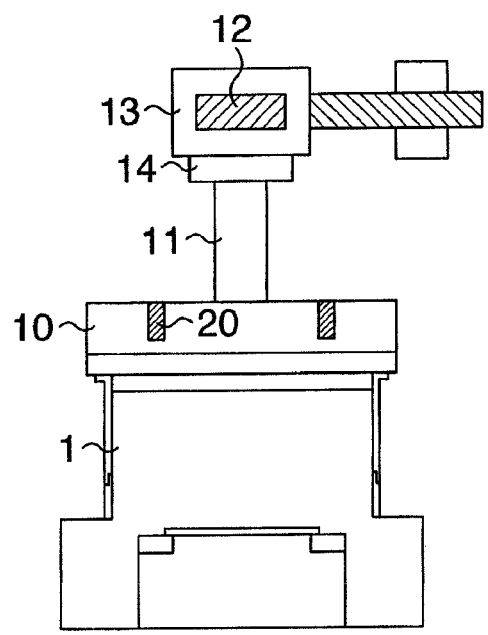
FIG. 7A and FIG. 7B illustrate a seventh embodiment regarding the µ-wave uniformalization used in the present invention.
Figure 7B:
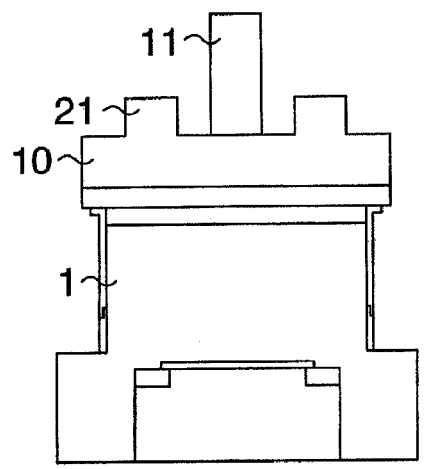

FIG. 7A and FIG. 7B illustrate a seventh embodiment of the present invention. Here, attention is focused on structure of the cavity unit 10 used in the plasma processing apparatus. As a unit for controlling/uniformalizing the μ-wave distribution in the radial direction, a ring-shaped metal 20 is used in the cavity unit 10. The ring-shaped metal 20 may be located in plural number, or a second cavity unit 21 may be provided. Whatever cavity unit is preferable as long as it is capable of implementing a state where height of the cavity unit varies in the radial direction.

Figure 8A:
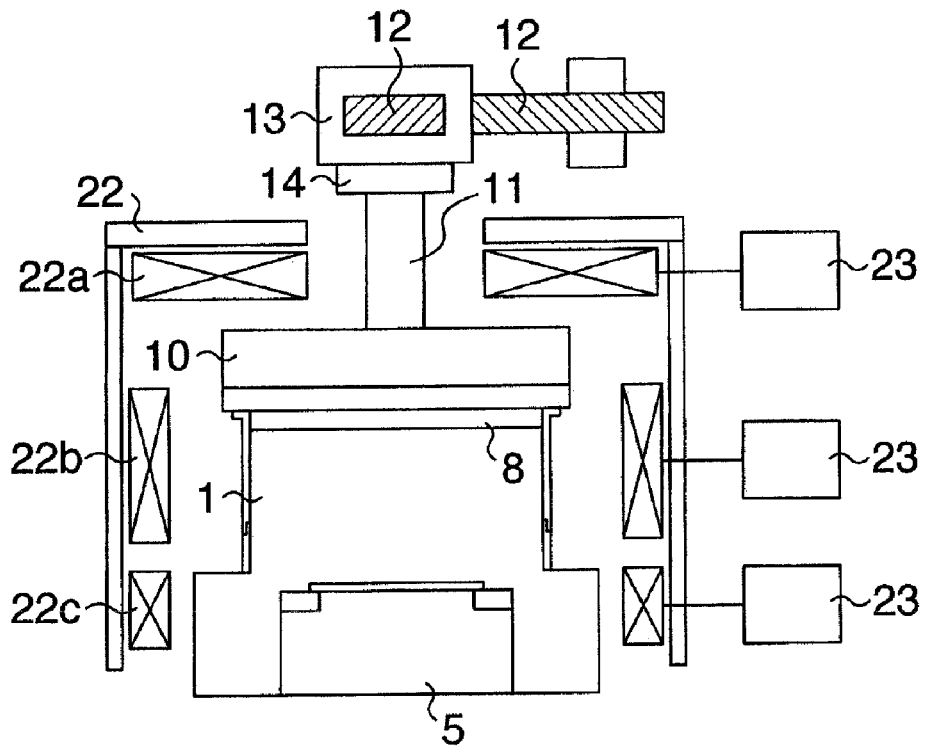
FIG. 8A to FIG. 8C illustrate an eighth embodiment regarding the μ-wave uniformalization used in the present invention.
Figure 8B:
Figure 8C:
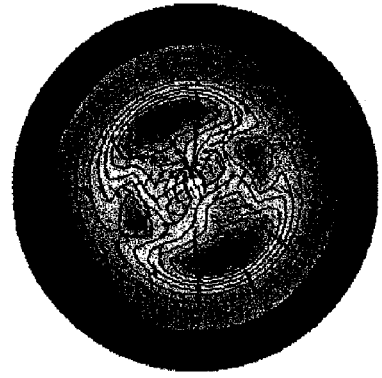

FIG. 8A to FIG. 8C illustrate an eighth embodiment of the present invention. A feature of this embodiment is that, in the plasma processing apparatus, there is provided a magnetic-field generation unit 22. Furthermore, time modulation may be applied to currents of coil power-sources 23 which are connected to coils 22a to 22c of the magnetic-field generation unit 22. Frequency of the time modulation is set at about 0.1 to a few Hz. For example, in the coil location in FIG. 8A, causing the current to pass through only the coil 22a makes it possible to generate a diverged magnetic field. Also, causing the current to pass through only 22b or 22c makes it possible to generate a magnetic field in the longitudinal direction. The μ-wave distribution on the plasma surface when the current is caused to pass through only 22a mainly becomes the $TE_{12}$ mode as is illustrated in FIG. 8B. The μ-wave distribution thereon when the current is caused to pass through only 22b becomes a distribution where the $TM_{11}$ and the $TE_{12}$ are mixed as is illustrated in FIG. 8C. In this way, changing the intensity of the magnetic field and the magnetic-field gradient makes it possible to change the μ-wave distribution not only in the radial direction but also in the circumferential direction. Here, the time modulation is applied to the coil power-sources 23 for a combination of the coils of 22a and 22b or 22a and 22c. This configuration allows the μ-wave distribution to be rotated in the circumferential direction. Here, combining the magnetic-field generation unit 22 with the circularly polarized wave unit allows the μ-wave distribution to be uniformalized in the circumferential and radial directions in a wide range of the plasma parameter.

In the present invention configured as described above, in the apparatus for generating plasma by using the μ wave, concerning the method for rotating the μ wave in terms of time, the plurality of (larger than two and smaller than four) waveguides are used, then forming an angle between the respective waveguides, and setting a phase difference between the respective electric fields therein. This configuration allows introduction of the circularly polarized wave into the processing chamber. At this time, the feature of this configuration is that there are provided the configuration components such as the waveguide locating method, the unit therefor, the μ-wave merging box, and the reflective-wave control unit using the reflection control chamber. This feature permits the μ wave to be rotated in terms of time and in a wide area of the plasma load by the reflective-wave control in response to a variation in the plasma load.

Figure 9A:
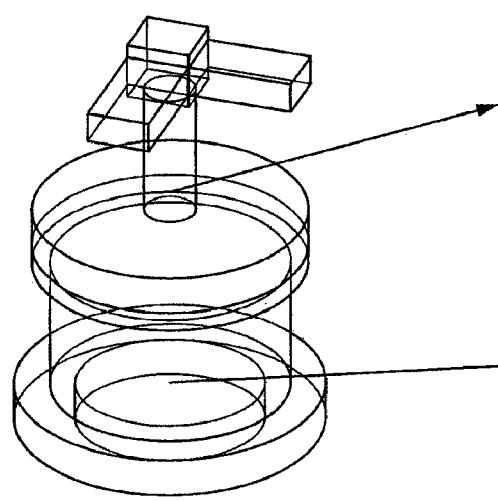
FIG. 9A to FIG. 9C illustrate effects acquired by the first embodiment of the present invention.
Figure 9B:
Figure 9C:
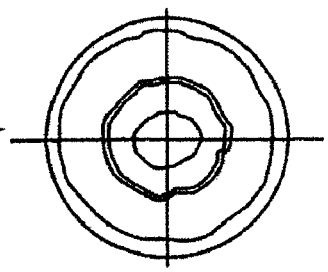
Figure 10A:
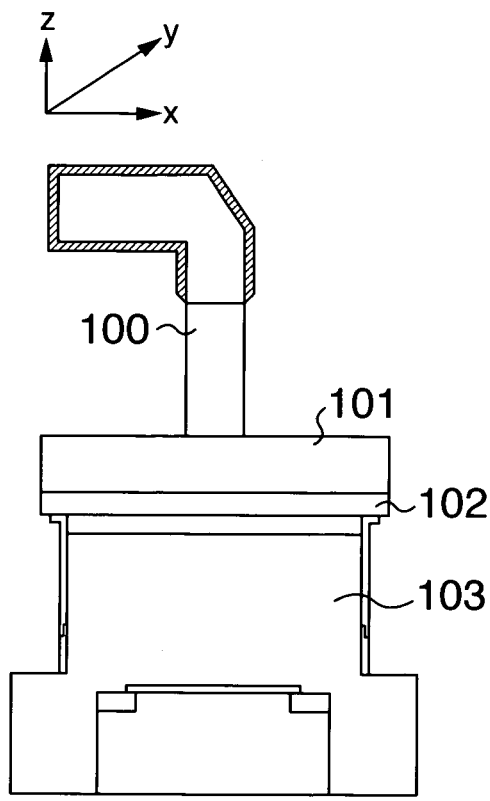
FIG. 10A to FIG. 10D illustrate the μ-wave distributions in the plasma processing apparatus according to the conventional embodiment.
Figure 10B:
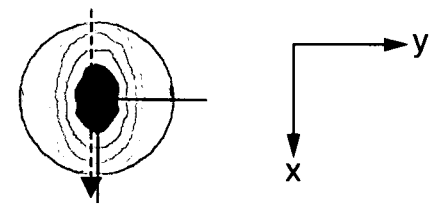
Figure 10C:
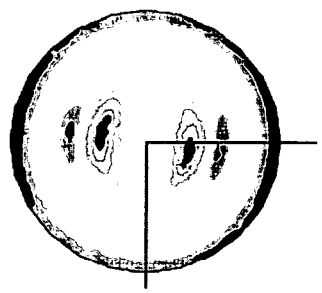
Figure 10D:
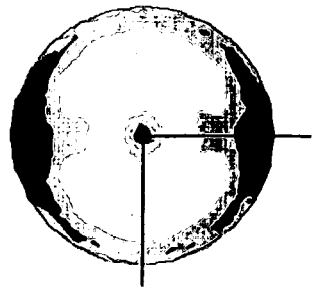
Figure 11A:
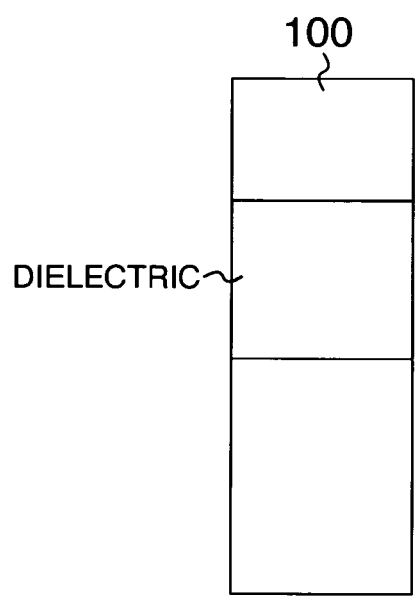
FIG. 11A to FIG. 11D illustrate the μ-wave distribution calculation results in the circularly polarized wave introduction unit in the conventional technology 1.
Figure 11B:
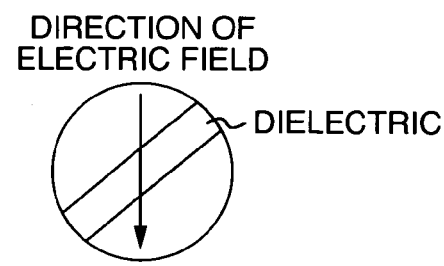
Figure 11C:
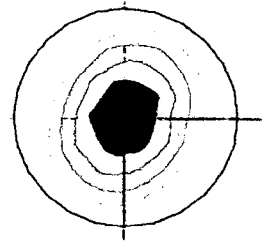
Figure 11D:
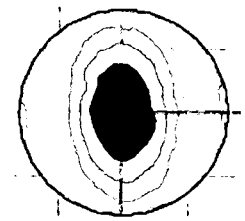

FIG. 9A to FIG. 9C illustrate effects acquired by the μ-wave rotation method according to the present invention. As the example, FIG. 9B illustrate in-waveguide electric-field contour lines, and FIG. 9C illustrate in-plasma electric-field contour lines at the time when the two waveguides are used, and when the μ waves are introduced from both of x and y directions with the phase difference 90° set therebetween. Distribution of the in-waveguide electric-field contour lines becomes substantially perfectly circular. Also, the in-plasma electric-field contour lines are uniformalized in the circumferential direction. FIG. 9B and FIG. 9C indicate that the uniformity in the circumferential direction has been tremendously improved in comparison with the result (FIG. 11D) of the in-waveguide electric-field contour lines in the case of the conventional technology 1 and the result (FIG. 10B) in the conventional embodiment.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:
1. A plasma processing apparatus, comprising:
a processing chamber having a vacuum, a gas being supplied to said processing chamber;
a support electrode provided inside said processing chamber and supporting a processing-target object;
an introduction window disposed on an upper side of the processing chamber through which a μ-wave is introduced into the processing chamber;
a cavity unit disposed above the introduction window such that a bottom surface thereof contacts the introduction window;
a circular waveguide connected to an upper surface of the cavity unit and extending substantially vertically, the circular waveguide being configured to propagate the μ-wave into the cavity unit and toward the introduction window;
a reflection suppressor coupled to the circular waveguide for suppressing a reflective wave propagated upward into the circular waveguide, the reflection suppressor comprising a chamber having a larger diameter than that of the circular waveguide;
a tuning box disposed above and connected to said reflection suppressor; and
two μ-wave waveguides connected to said tuning box and disposed such that each of the two p-wave waveguides have axes that are on a flat plane which is substantially parallel to said tuning box or perpendicular to an axis of said waveguide and are set with an angle of substantially 90° therebetween, said two μ-wave waveguides introducing said μ-waves which are set a phase difference therebetween of substantially 90° in respective electric fields from said two directions to said tuning box,
wherein said tuning box superimposes said respective μ-wave and generates a circularly polarized wave in a predetermined mode that is propagated inside the circular waveguide toward the introduction window.
2. A plasma processing apparatus, comprising:
a processing chamber having a vacuum, a gas being supplied to said processing chamber;
a support electrode provided inside said processing chamber and supporting a processing-target object;
an introduction window disposed on an upper side of the processing chamber through which a μ-wave is introduced into the processing chamber;
a cavity unit disposed above the introduction window such that a bottom surface thereof contacts the introduction window;
a circular waveguide connected to an upper surface of the cavity unit and extending substantially vertically, the circular waveguide being configured to propagate the μ-wave into the cavity unit and toward the introduction window;
a reflection suppressor coupled to the circular waveguide for suppressing a reflective wave propagated upward into the circular waveguide, the reflection suppressor comprising a chamber having a larger diameter than that of the circular waveguide;
a tuning box disposed above and connected to said reflection suppressor; and
a plurality of μ-wave waveguides which are connected to said tuning box and disposed such that each of the plurality of μ-wave waveguides have axes that are on a flat plane which is substantially parallel to said tuning box or perpendicular to an axis of said waveguide, said plurality of p-wave waveguides introducing said μ-waves from different directions respectively to said tuning box, wherein said tuning box superimposes said respective µ-waves and generates a circularly polarized wave in a predetermined mode that is propagated inside the circular waveguide toward the introduction window, and wherein said µ-wave is introduced from n (>2) directions, with an angle of substantially 360/n° set between said respective introduction directions, and with a phase difference of substantially 360/n° being set between said respective electric fields.

3. The plasma processing apparatus according to claim 1 or 2, wherein each of said µ-wave waveguides has a rectangular shape and is capable of modifying intensities of said µ-wave thereinside.

4. The plasma processing apparatus according to claim 1 or 2, wherein each of said µ-wave waveguides has a rectangular shape, and electric power is fed to each of said µ-wave waveguides by a single power-feeding unit.

5. The plasma processing apparatus according to claim 1 or 2, wherein a higher order mode of µ-wave is generated inside the reflection suppressor.

* * * * *